US009829556B2

(12) United States Patent
Hsu et al.

(10) Patent No.: US 9,829,556 B2
(45) Date of Patent: Nov. 28, 2017

(54) METHOD AND APPARATUS FOR GENERATING A SPECIFIC FLIP ANGLE DISTRIBUTION IN MRI

(71) Applicant: National Taiwan University, Taipei (TW)

(72) Inventors: Yi-Cheng Hsu, Taipei (TW); I-Liang Chern, Taipei (TW); Fa-Hsuan Lin, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 705 days.

(21) Appl. No.: 14/321,273

(22) Filed: Jul. 1, 2014

(65) Prior Publication Data

US 2015/0185301 A1  Jul. 2, 2015

(30) Foreign Application Priority Data

Dec. 31, 2013  (TW) .............................. 102149210 A

(51) Int. Cl.
| | | |
|---|---|---|
| *G01V 3/00* | (2006.01) |
| *G01R 33/565* | (2006.01) |
| *G01R 33/483* | (2006.01) |
| *G01R 33/561* | (2006.01) |
| *G01R 33/24* | (2006.01) |

(52) U.S. Cl.
CPC ..... *G01R 33/5659* (2013.01); *G01R 33/4833* (2013.01); *G01R 33/5612* (2013.01); *G01R 33/246* (2013.01)

(58) Field of Classification Search
CPC .................................................. G01R 33/5659
USPC ........................................ 324/309, 307, 314
See application file for complete search history.

(56) References Cited

U.S. PATENT DOCUMENTS

| | | | | |
|---|---|---|---|---|
| 6,982,554 | B2* | 1/2006 | Kurpad ............ | G01R 33/34046 324/318 |
| 7,218,113 | B2* | 5/2007 | Feiweier ............ | G01R 33/5612 324/318 |
| 7,411,395 | B2* | 8/2008 | Hennig ................ | G01R 33/385 324/307 |
| 9,329,251 | B2* | 5/2016 | Lin ...................... | G01R 33/483 |
| 2010/0171499 | A1* | 7/2010 | Sharp ................. | G01R 33/3415 324/318 |

* cited by examiner

*Primary Examiner* — Louis Arana
(74) *Attorney, Agent, or Firm* — Bacon & Thomas, PLLC

(57) ABSTRACT

The present invention provides a method and apparatus for generating a specific flip angle distribution in magnetic resonance imaging; the method uses a plurality of RF transmission coils combined with linear and nonlinear spatial encoding magnetic fields to generate a homogeneous flip angle distribution.

6 Claims, 7 Drawing Sheets

METHOD AND APPARATUS FOR GENERATING A SPECIFIC FLIP ANGLE DISTRIBUTION IN MRI

RELATED APPLICATIONS

This application claims priority to Taiwan Application Serial Number 102149210, filed on Dec. 31, 2013, which is herein incorporated by reference.

BACKGROUND

Technical Field

The present disclosure relates to magnetic resonance imaging (MRI); more particularly, the present disclosure relates to method and apparatus for generating a flip angle distribution in MRI.

Description of Related Art

High-field MRI offers a great promise to generate images with high signal-to-noise ratio (SNR). Yet the major technical challenge is the inhomogeneous flip angle distribution when a volume RF coil is used for RF excitation. This artifact is due to the deleterious interaction between the dielectric properties of the sample and the radio-frequency field; consequently, when an object with the size approximating to the human head is imaged by high-field ($>=3T$) MRI, the flip angle distribution is spatially varying, where typically a larger flip angle at the center of the field-of-view (FOV) and a smaller flip angle at the periphery of the FOV. This causes images with a spatially dependent $T_1$ contrast, which makes clinical diagnosis difficult.

Different methods for mitigating $B_1^+$ inhomogeneity have been proposed; for example, dedicated volume radio-frequency (RF) coils have been designed for use in high-field MRI; another method is using spatially selective RF excitation, wherein spatially selective RF excitation designs RF and gradient waveforms to form an inhomogeneous $B_1^+$ field in a volume coil, and finally generates a more homogeneous flip angle distribution. Alternatively, it has been suggested that flip angle distribution can become more homogeneous by using simultaneous RF excitation from multiple RF coils, such as RF shimming and transmit SENSE. Notably, parallel RF transmission (pTx) methods allow higher degree of freedom in RF pulse and gradient waveform design than RF shimming, because different RF pulse waveforms can be delivered to each RF coil independently; however, the challenges of parallel RF transmission method include the complexity of the RF electronics and coil construction in order to achieve simultaneous excitation, the necessity of accurate estimates of phases and amplitudes of the $B_1^+$ maps for each RF coil, and the specific absorption rate (SAR) management.

Recently, it has been demonstrated that nonlinear spatial encoding magnetic fields (SEMs) can be used in MRI spatial encoding in order to improve spatiotemporal resolution; preliminary studies using quadratic nonlinear SEMs for RF excitation and small FOV imaging have been reported. Nonlinear spatial encoding magnetic fields can also be used to mitigate the inhomogeneity of the flip angle distribution; under the small flip angle approximation, there are theories indicating how the spatial distribution of the flip angle is controlled by time-varying linear and nonlinear spatial encoding magnetic fields and RF pulse waveforms.

In summary, different techniques have been broached to improve the uniformity of the flip angle spatial distribution in high field MRI; however, at present time, there is no such technique which combines RF shimming and the usage of linear and nonlinear spatial encoding magnetic fields to achieve a homogeneous flip angle distribution.

SUMMARY

Under the small flip angle approximation, the present invention incorporates RF shimming technique and the method of remapping the $B_1^+$ map into a lower dimension coordinate system. If the remapping is successful, the iso-intensity contours of the SEMs are similar to the iso-intensity contours of $B_1^+$ field, which helps pulse sequence design using linear and nonlinear SEMs to achieve a homogeneous flip angle distribution. The present invention incorporates RF shimming technique with the technique of linear and nonlinear SEMs; without the constraint of using parallel transmission techniques, a RF excitation with spatial selectivity can be accomplished effectively, and a homogeneous flip angle distribution can be achieved.

The present invention provides a method for generating a flip angle spatial distribution of magnetic resonance imaging, comprising: incorporating the usage of one or a plurality of spatial encoding magnetic fields and the usage of a plurality of RF coils to generate a specific spatial distribution of flip angle, wherein the plurality of RF coils excite a $B_1^+$ field jointly, the ratio of signal amplitudes of the plurality of RF coils is kept invariant during the excitation process, and the phase relationship of signals from the plurality of RF coils is kept invariant during the excitation process.

Preferably, in the aforementioned method for generating a flip angle spatial distribution of magnetic resonance imaging, the plurality of spatial encoding magnetic fields include linear and nonlinear spatial encoding magnetic fields.

Preferably, in the aforementioned method for generating a flip angle spatial distribution of magnetic resonance imaging, the generated spatial distribution of flip angle is substantially homogeneous.

Preferably, the aforementioned method for generating a flip angle spatial distribution of magnetic resonance imaging further comprising adjusting the signal amplitudes of the plurality of RF coils by a single controller, wherein the ratio of signal amplitudes and the phase relationship of signals of the plurality of RF coils are kept invariant during the excitation process.

In another aspect, the present invention provides an apparatus for generating a flip angle spatial distribution of magnetic resonance imaging, comprising: one or a plurality of spatial encoding magnetic field coils; and a plurality of RF coils incorporated with the one or plurality of spatial encoding magnetic field coils to generate a specific spatial distribution of flip angle, wherein the plurality of RF coils excite a $B_1^+$ field jointly, the ratio of signal amplitudes of the plurality of RF coils is kept invariant during the excitation process, and the phase relationship of signals from the plurality of RF coils is kept invariant during the excitation process.

BRIEF DESCRIPTION OF THE DRAWINGS

The disclosure can be more fully understood by reading the following detailed description of the embodiments, with reference made to the accompanying drawings as follows.

DETAILED DESCRIPTION

Theory

Figure 1:
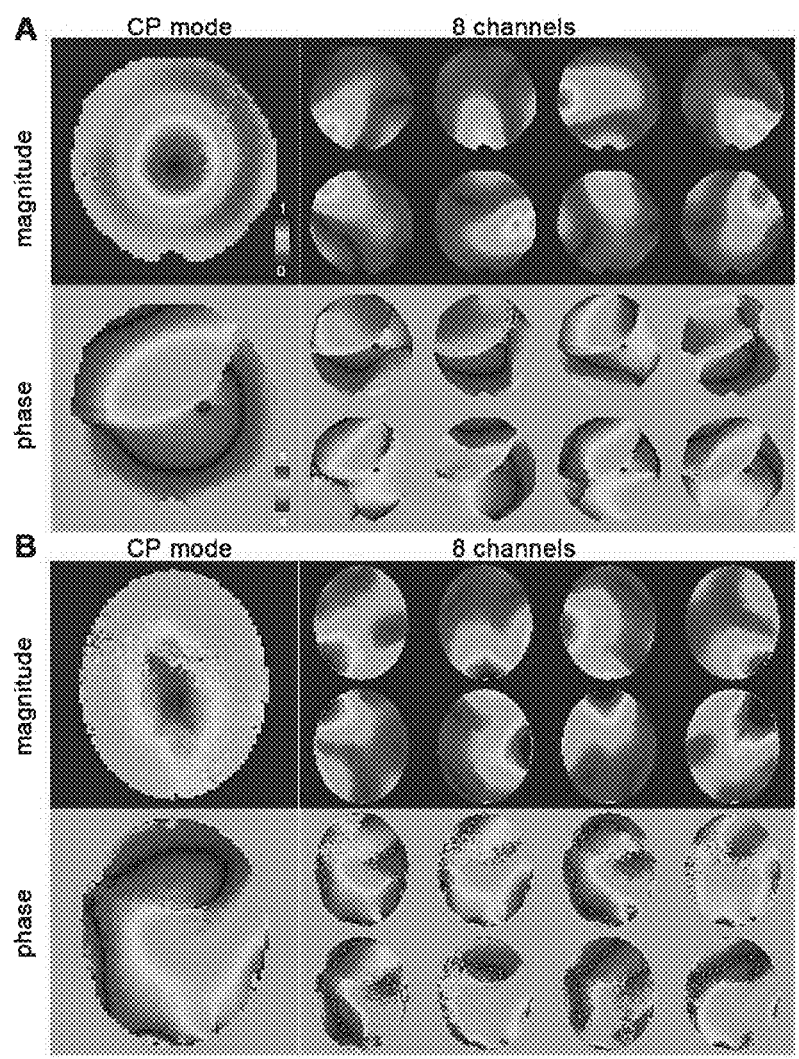
FIG. 1A shows the $B_1^+$ amplitude and phase maps of 8 transmit channels and the CP mode combination in a saline phantom
FIG. 1B shows the $B_1^+$ amplitude and phase maps of 8 transmit channels and the CP mode combination in a human head.

A. Spatially Selective RF Excitation with Generalized Spatial Encoding Magnetic Fields (SAGS) Under the Small Flip Angle Approximation To allow the complete description of combined SAGS and RF-shimming, we first introduce the necessary theoretical framework. For an MRI system with n distinct configurations of SEMs turning on during RF excitation, we use the dimensionless variable $f(r)=[f_1(r), \ldots, f_n(r)]$ to describe the spatial distributions of the z-components of these SEMs. To facilitate the description of the arbitrary spatial distribution of f(r), we define the maximal and the minimal values among all components of f(r) within the imaging object to be 1 and 0, respectively. $g(t)=[g_1(t) \ldots g_n(t)]$ describes the instantaneous magnetic field strength of each individual SEM. Accordingly, each component of g(t) clearly defines the instantaneous difference between the minimal and maximal z-component of the magnetic field generated by each SEM within the imaging object. The instantaneous additional z-component of the magnetic field at location r is thus the inner product g(t)·f(r). Here we assume that the RF transmit field $B_1^+(r,t)$ is spatiotemporally separable: $B_1^+(r,t)=B_{1,r}^+(r) B_{1,t}^+(t)$, where $B_{1,t}^+(t)$ is a waveform of the RF transmit field, and $B_{1,r}^+(r)$ is a spatial distribution of the ratio between $B_1^+(r,t)$ and $B_1^+(t)$.

Taking the small flip angle approximation (1) and assuming the initial magnetization $[M_x(r,0), M_y(r,0), M_z(r,0)]^T=[0, 0, 1]^T$, the spatial distribution of the transverse magnetization $M_{xy}(r)$, the RF pulse waveform $B_{1,t}^+(t)$, and the temporal integral of SEMs (linear/nonlinear MRI gradients) over time are related to each other by an inverse Fourier transform (2-4)

$$M_{xy}(r) = \int_K W(k)B_{1r}^+(r)\exp[j2\pi f(r) \cdot k]\delta(k)dk \quad [1]$$

$$W(k) = W(k(t)) = \frac{j\gamma B_{1t}^+(t)}{|k'(t)|}$$

$$k(t) = [k_1(t), \ldots, k_n(t)] = \gamma \int_t^T g(u)du.$$

Note that the notation k(t) in this study is different from that in conventional MRI (1): we chose k(t) to express the maximal phase difference of the transverse magnetization precession within the imaging object at time instant t. Since a k-space trajectory has the one-to-one correspondence between k(t) and t, we omit the t argument in k(t) and use k in the following. Additionally, we use a delta function δ(k), which is nonvanishing at all excited k-space points, to describe a k-space trajectory.

To achieve a practical slice-selective RF excitation, we propose to use a spoke k-space trajectory (5), with spokes locate at $k_s$ and s∈S, where S denotes the set including all spokes. Without losing generality, we consider that the slices are distributed over the z-axis and that only the central slice (z=0) is excited. Accordingly, Eq. [1] in a spoke k-space trajectory becomes $$M_{xy}(x, y) = B_{1r}^+(x, y)\sum_{s \in S} W_F(k_s)\exp[2\pi jk_s \cdot f(x, y)], \quad [2]$$

where $M_{xy}(x,y)$ is the distribution of the excited transverse magnetization at z=0 plane. It should be noted that $M_{xy}(x,y)/B_1^+(x,y)$ and f(x,y)=(x,y) are related by a 2D Fourier transform. Naturally such a design is on a 2D space.

SAGS seeks to remap $M_{xy}(x,y)/B_1^+(x,y)$ by a new variable h(x,y) with dimension lower than that of f(x,y) (6). Using a spoke trajectory and considering a 2D slice-selective excitation scheme, the range of h(x,y) is one dimensional: h(x,y)=h(x,y). If this remapping is possible, then Eq. [2] becomes $$M_{xy}(x, y)/B_1^+(x, y) \approx \tilde{M}_{xy}(h(x, y)) = \sum_{s \in S} W_F(k_s)\exp[2\pi jk_s \cdot f(x, y)]. \quad [3]$$

This shows that remapping can be advantageous if $\tilde{M}_{xy}(h(x,y))$ can be represented by a few spokes using a one dimensional variable h(x,y). Specifically, Eq. [3] shows that $M_{xy}(x,y)/B_1^+(x,y)$ and h(x,y) are now related by a 1D Fourier transform. Accordingly, such a design is now on a 1D space. Reducing the k-space dimension after $B_1^+$ remapping implies that a shorter k-space trajectory can be used to achieve a similar distribution of the transverse magnetization.

B. Combined SAGS and RF Shimming

When RF shimming hardware is available, $B_1^+(x,y)$ in Eq. [3] can be any linear combination of the $B_1^+$ maps of the multiple RF coils. Thus we may be able to find one linear combination of $B_1^+$ maps $$B_{1comb}^+(x, y) = \sum_{c=1}^{n_c} \xi_c B_1^c(x, y) \quad [4]$$

such that $M_{xy}(x,y)/B_{1comb}^+(x,y)$ can be better approximated by $\tilde{M}_{xy}(h(x,y))$. Here $n_c$ denotes the number of RF coils. $B_1^c(x,y)$ denotes the $B_1^+$ map of RF coil channel c.

The combined SAGS and RF shimming method needs to find the remapping variable $h(x,y)$, the remapping function $\tilde{M}_{x,y}(\bullet)$, and $\xi_c$ coefficients for $B_{1comb}^+(x,y)$, such that the following approximation holds:

$$M_{xy}(x,y)/B_{1comb}^+(x,y) \approx \tilde{M}_{xy}(h(x,y)) \quad [5]$$

C. Homogeneous Flip Angle Excitation

When aiming at achieving a homogeneous flip angle distribution, we only considered the magnitude of the combined $B_1^+$, since the phase distribution is generally not important in most clinical applications.

$$B_{1shim}^+(x, y) = \left| \sum_{c=1}^{n_c} \xi_c B_1^c(x, y) \right| \quad [6]$$

$B_{1shim}^+(x,y)$, is the absolute value of the combined $B_1^+$ maps, i.e., $B_{1comb}^+(x,y)$, in Eq. [4]. In this study, we also assumed that only SEMs of polynomial order 2 or lower could be used:

$$h(x, y) = \sum_{q=0}^{2} \sum_{r=0}^{q} v_{q,r}(x^r, y^{q-r}). \quad [7]$$

Using $m_{xy}$ to denote the desired spatial distribution of transverse magnetization, we assumed that $m_{xy}/B_{1shim}^+(x,y)$ is spatially smooth. Considering in our case that $m_{xy}/B_{1shim}^+(x,y)$ is real valued, we could arbitrarily use a linear combination of p cosine functions to approximate $\tilde{M}_{xy}(\bullet)$ parameterized by h:

$$\tilde{M}_{xy}(h) = \sum_{q=0}^{p-1} \kappa_q \cos(qh). \quad [8]$$

The reasons we chose cosine functions are: 1) cosine functions are good bases when there is a sufficient number of harmonics, 2) cosine functions are related to even number of spokes located in conjugated locations in k-space. For example, when only q=1 is used in equation [8], $\tilde{M}$ can be realized by two spokes, which are symmetrically located around the k-space origin with equal amplitudes and conjugate phases.

In summary, our proposed pulse design is an optimization problem aiming at adjusting parameters $\{\kappa, \xi, v\}$ to minimize the following error:

$$\{\kappa^{opt}, \xi^{opt}, v^{opt}\} = \quad [9]$$

$$\operatorname*{argmin}_{\kappa, \xi, v} \left\| 1 - \left| \left( \sum_{c=1}^{n_c} \xi_c B_1^c(x, y) \right) \sum_{s=0}^{p-1} \kappa_s \cos\left( \sum_{q=0}^{2} \sum_{r=0}^{q} v_{q,r}(x^r y^{q-r}) \right) \right| \right\|_2^2$$

After we obtain the remapping coefficients $\{\xi^{opt}, v^{opt}\}$, we solve the optimization problem to determine the spoke locations in the $k_z$-$k_h$ space, which are symmetrically distributed around the k-space center, and spoke amplitudes to achieve a homogeneous flip angle distribution:

$$\{\alpha^{opt}, \beta^{opt}\} = \operatorname*{argmin}_{\alpha, \beta} \left\| m_{xy} - \beta_{1shim}(x, y) \sum_{s=1}^{S} \alpha_s \exp(j\beta_s h(x, y)) \right\|_2^2 \quad [10]$$

D. Algorithm

We used the following algorithm to derive all parameters $\{\xi^{opt}, v^{opt}, \alpha^{opt}, \beta^{opt}\}$, separating the pulse design process into two parts.

Part I

The first part aims to solve the optimization problem defined in Eq. [9].

Step 1. Initialization

We first assume that $\tilde{M}_{xy}(\bullet)$ can be approximated by one cosine function. Our chosen initial guess for $\xi_c$ is the circular-polarized (CP) mode (7), and the initial guess for $\kappa_p$ is $$\kappa_p^{old} = \begin{cases} \max\{1/B_{1shim}^+(x, y)\}, & p = 1 \\ 0, & \text{otherwise} \end{cases}.$$

Accordingly, $$v = \operatorname*{argmin}_{v_{q,r}} \left\| \sum_{q=0}^{2} \sum_{r=0}^{q} v_{q,r}(x^r, y^{q-r}) - \arccos\left( \frac{1}{\alpha_1 B_{1shim}^+(x, y)} \right) \right\|_2^2.$$

We also define $B_{1phase}^{+old}(x,y)$ as the phase distribution of $$\sum_{c=1}^{n_c} \xi_c^{old} B_1^c(x, y).$$

Step 2. Iterative Updating

Using a combination of the gradient descent algorithm and least squares solution iteratively, we adjust { } to minimize $$\Phi(\kappa_1, \gamma, v, B_{1phase}^+(x, y)) =$$

$$\left\| e^{jB_{1phase}^+(x,y)} - \kappa_1 \left( \sum_{c=1}^{n_c} \xi_c B_1^c(x, y) \right) \cos\left( \sum_{q=0}^{2} \sum_{r=0}^{q} v_{q,r}(x^r, y^{q-r}) \right) \right\|_2^2,$$

where $B_{1phase}^{+}(x,y)$ denotes the phase distribution of $$\sum_{c=1}^{n_c} \xi_c B_1^c(x, y).$$

Specifically,

Step 2.1:

With given $\{\kappa^{old}, \xi^{old}, \nu^{old}, B_{1phase}^{+old}(x,y)\}$, we updated the value of $\nu_{q,r}$ using the gradient descent algorithm with the step size $\lambda$:

$\nu^{new} = \nu^{old} - \lambda \nabla_\nu \Phi$. Note if $\Phi(\kappa^{old}, \xi^{old}, \nu^{new}, B_{1phase}^{+old}(x,y)) \geq \Phi(\kappa^{old}, \xi^{old}, \nu^{old}, B_{1phase}^{+old}(x,y)).\lambda$ must be reduced by half and Step 2.1 should be repeated.

Step 2.2:

Use a least squares algorithm to find the new $\kappa_1$:

$$\kappa_1^{new} = \underset{\alpha_1}{\operatorname{argmin}}\{\Phi(\kappa_1, \xi^{old}, \nu^{new}, B_{1phase}^{+old}(x, y))\}$$

Step 2.3:

Use a least squares algorithm to find the new:

$$\xi^{new} = \underset{\gamma}{\operatorname{argmin}}\{\Phi(\kappa_1^{new}, \xi^{old}, \nu^{new}, B_{1phase}^{+old}(x, y))\}.$$

Update $B_{1phase}^{+}(x,y)$ using $\xi^{new}$: $B_{1phase}^{+new}(x,y)$ the phase distribution of $$\sum_{c=1}^{n_c} \xi_c^{new} B_1^c(x, y).$$

We repeat Step 2 until the cost converges: $\Phi(\kappa^{old}, \xi^{old}, \nu^{old}, B_{1phase}^{+old}(x,y)) - \Phi(\kappa^{old}, \xi^{old}, \nu^{new}, B_{1phase}^{+old}(x,y)) < \epsilon$. When not converging, we update $\{\kappa_1^{old}, \xi^{old}, \nu^{old}, B_{1phase}^{+old}(x,y)\} \leftarrow \{\kappa_1^{new}, \xi^{new}, \nu^{new}, B_{1phase}^{+new}(x,y)\}$ and repeat Step 2.1 to Step 2.3. At convergence, we obtain the optimized parameters $\{\kappa_1^{opt}, \xi^{opt}, \nu^{opt}\} \leftarrow \{\kappa_1^{new}, \xi^{new}, \nu^{new}\}$. This gives us the optimal design with 2 spokes.

For a trajectory using more than 2 spokes, we first optimize two spokes using steps 1 and 2 to obtain $\{\kappa_1^{opt}, \xi^{opt}, \nu^{opt}\}$. This gives us the initial guess for $\{\kappa_1^{opt}, \xi^{opt}, \nu^{opt}\}$. Then, we use the same procedure in step 2 to obtain $\{\kappa_1^{opt}, \xi^{opt}, \nu^{opt}\}$, except that now in step 2.2 all $\kappa_p$ should be updated.

Part II.

The second part of the pulse design uses the estimated $B_{1shim}^{+}(x,y)$ and $h(x,y)$ to find spoke locations and strengths (Eq. 10). It should be noted that the optimization in Part I provides optimized $\kappa_p$ corresponding to locations and amplitudes of spokes. In Part II of our algorithm, we seek to further reduce the error in Eq. [9] by using the same number of spokes in different locations or to approximate the similar error by using fewer spokes. To do this, we use the optimized $\{\xi^{opt}, \nu^{opt}\}$ to exhaustively search all possible locations $\beta_s$, which are symmetrically located around 0. The amplitudes for these 2S spokes are expressed by $\alpha_s$ The optimization for these 2S spokes now becomes $$\{\alpha, \beta\} = \underset{\alpha, \beta}{\operatorname{argmin}} \left\| m_{xy} - \beta_{1shim}^{+} \sum_{s=1}^{S} \alpha_s \exp(j\beta_s h(x, y)) \right\|_2^2 + \lambda \|\alpha\|_2^2.$$

We added a regularization term $\|\alpha\|_2^2$ in the cost function to suppress solutions requiring excessive peak power.

1st Embodiment

Comparison Between RF Shimming with $B_1^{+}$ Remapping and Conventional RF Shimming In the first embodiment of the present invention, the sample was modeled as a uniform sphere with average brain electrical properties at 7 T (dielectric constant $\epsilon_r=52$, electric conductivity $\sigma=0.55$ S/m). The full-wave electromagnetic (EM) field produced by a circular surface coil adjacent to the homogeneous sphere was expressed in the form of a semi-analytical multipole expansion (8,9). The EM field can be appropriately rotated to express the EM field of any identical circular coil at a different position near the surface of the sphere, with respect to the same reference frame of the sample (9). We modeled a 20-element transmit array of identical circular coils uniformly packed around the sphere and for each coil we calculated the magnetic field ($B_1$) for a uniform grid of voxels (32×32) on a transverse FOV through the center of the object. Simulated $B_1^{+}$ maps were computed for each element of the transmit arrays as $B_1^{+}(r) = B_{1x}(r) + i\, B_{1y}(r)$, where i is the imaginary unit and r is the voxel position. All calculations were implemented using MATLAB (Mathworks, Natick, USA) on a standard PC.

2nd Embodiment

Comparison of the Homogeneity of Transverse Magnetization $|M_{xy}|$ Relative to RF Power from Different Techniques In the second embodiment of the present invention, both phantom and in-vivo $B_1^{+}$ maps were obtained using a Siemens 7T Magnetom scanner equipped with an 8-channel pTX-setup (Siemens, Erlangen, Germany). For this purpose a custom 8-element transceive head coil array was used (10). First the Actual Flip-angle Imaging (AFI) method (11) was used to obtain a quantitative $B_1^{+}$ map corresponding to the CP mode (3 mm isotropic resolution, TR1/TR2=30/150 ms, TE=1.5 ms, max flip-angle +/−90 deg). Subsequently a multi-slice Fast Low Angle Shot (FLASH) sequence was used to measure the relative signal amplitudes and phases corresponding to each of the individual channels and CP-mode (3 mm isotropic resolution, TR=500 ms, TE=2.0 ms max flip-angle +/−10 deg). Finally, using the CP-mode, one additional FLASH image was obtained with a longer TE=2.5 ms. Combining both CP-mode FLASH images a $\Delta B_0$ was constructed. The quantitative $B_1^{+}$ maps corresponding to each of the individual transmit-channels were derived as described in (12). The same sequence parameters were used for both phantom and in-vivo measurements. Informed consent was obtained from each volunteer, in accordance with the regulations of our institution.

3rd Embodiment

The noise in estimating the $B_1^{+}$ from the empirical data can be observed as some sharp variations in the $B_1^{+}$ maps. To reduce noise, we used a total variation (TV) denoising method (13). The RF shimming coefficients for generating a homogenous $B_1^{+}$ distribution were calculated based on the magnitude least square method (14) using CP mode as the initial guess. We also compared RF-shim using original $B_1^+$ and the denoised $B_1^+$ to verify that the denoising process will not cause extra artifact.

In all cases, for both simulated and experimental data, we designed pulses to achieve a homogenous 10° flip angle distribution. In practice, we only searched the optimal solutions for 2 and 4 spokes located at conjugate locations. After optimizing pulse sequence design, the flip angle distribution was calculated based on the Bloch equations. The performance of $|B_1^+|$ mitigation was evaluated by the relative standard deviation σ (15):

$$\sigma=\text{std}(|M_{xy}|)/\text{mean}(|M_{xy}|), \quad [10]$$

where std(•) and mean(•) indicate the standard deviation and the mean of the transverse magnetization, respectively. Note that σ is a constant when the flip angle is small, because the standard deviation and mean of $M_{xy}$ are linearly proportional to each other.

To evaluate $B_1^+$ remapping, we plotted pairs $(h(x,y), 1/B_{1shim}^+(x,y))$ for all voxels inside the imaging object. In the case of perfect remapping (Eq. [3]), all pairs should be represented by one curve (h). To quantify the accuracy of $B_1^+$ remapping, we estimated a $10^{th}$-order polynomial based on all $(h(x,y), 1/B_{1shim}^+(x,y))$ and calculated the errors between data pairs and the fitted curve. The error in $B_1^+$ remapping was quantified as the $\text{std}(1/B_{1shim}^+(x,y)-(h(x,y)))/\text{mean}((h(x,y)))$. For comparison, we also simulated the flip angle distribution using the fast $k_z$ method (5) and the tailored excitation method (15) using conventional RF-shim, which aims at achieving a homogeneous $B_1^+$ distribution. This should be distinguished from the RF shimming used in our SAGS method, for which we aim at achieving a homogeneous $M_{xy}$ without constraining the RF shim to achieve a homogeneous $B_1^+$ distribution directly. In other words, we allow RF shim to achieve a tailored $B_1^+$ distribution, which will be used by SAGS to achieve a homogeneous $M_{xy}$ distribution. To estimate the energy deposition associated with each method, for the simulated data we computed the global specific absorption rate (SAR) for each excitation, using a previously published method (9). For experimental data, we listed the relative amplitudes of spoke at each transmit coil comparing to the CP mode, such that they generated the same average $|B_1^+|$. To make sure the number of spokes number was sufficient in our algorithm, we simulated 99 equi-spaced spokes SAGS, which uses the same $B_{1shim}^+(x,y)$ and $h(x,y)$ as 4 spokes SAGS. We also simulated the flip angle distribution using 4 spokes SAGS with the outcome of a conventional RF shim as the initial guess in our algorithm step 1 to investigate how the initial guess affects the optimization.

Figure 2:
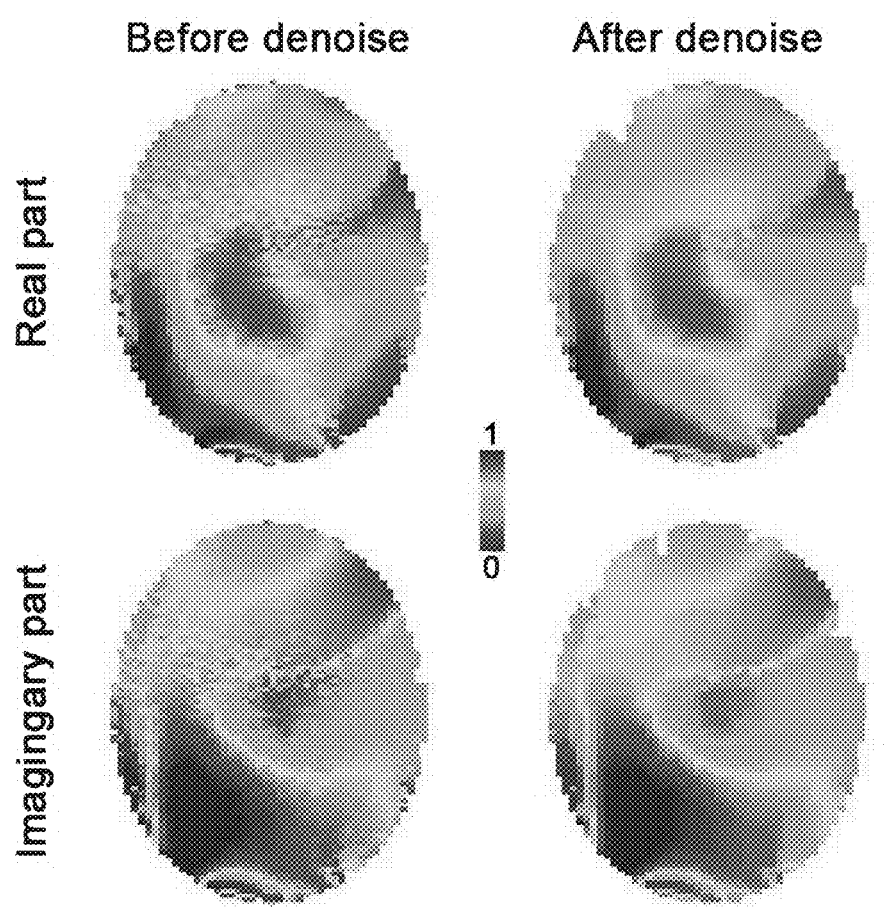
FIG. 2 shows the real and imaginary parts of the $B_1^+$ maps before and after total variation (TV) de-noising of channel 1 using human head data.
Figure 3:
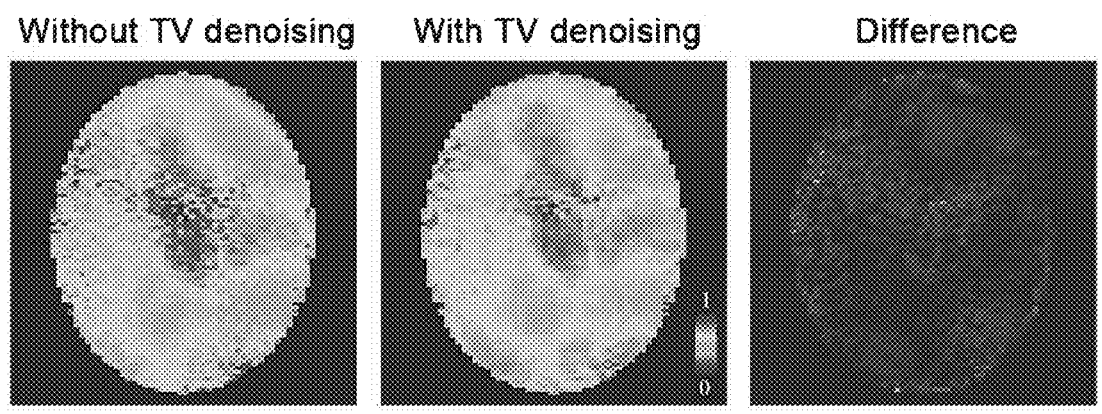
FIG. 3 shows the spatial distribution of $B_1^+$ using RF shimming with original 8 $B_1^+$t maps from 8 transmit coils in a human head (left), RF shimming with TV denoised 8 $B_1^+$t maps from 8 transmit coils in a human head (middle), and the difference of the distribution of the $B_1^+$ map between these two (right).

FIG. 1 shows the measured in vivo $B_1^+$ maps of the brain and phantom measured at 7 T. FIG. 2 shows one representative channel of the in vivo $B_1^+$ map before and after TV denoise processing. It can been seen that both real and imaginary parts were spatially smooth after denoising. FIG. 3 shows the distribution of $B_1^+$ map after applying conventional RF shimming, where $B_1^+$ maps were with and without TV denoising processing. We observed that the difference between two RF shims using original and denoised $B_1^+$ maps is moderate. In particular, the sharp magnitude discontinuity exists in both cases, potentially due to $B_1^+$ estimation error. In the subsequent analyses, we used denoised $B_1^+$ maps for $B_1^+$ remapping and RF shimming design because we expect spatially smooth $B_1^+$ maps based on electromagnetic theory and we want to avoid the error in assessing remapping accuracy.

Figure 4:
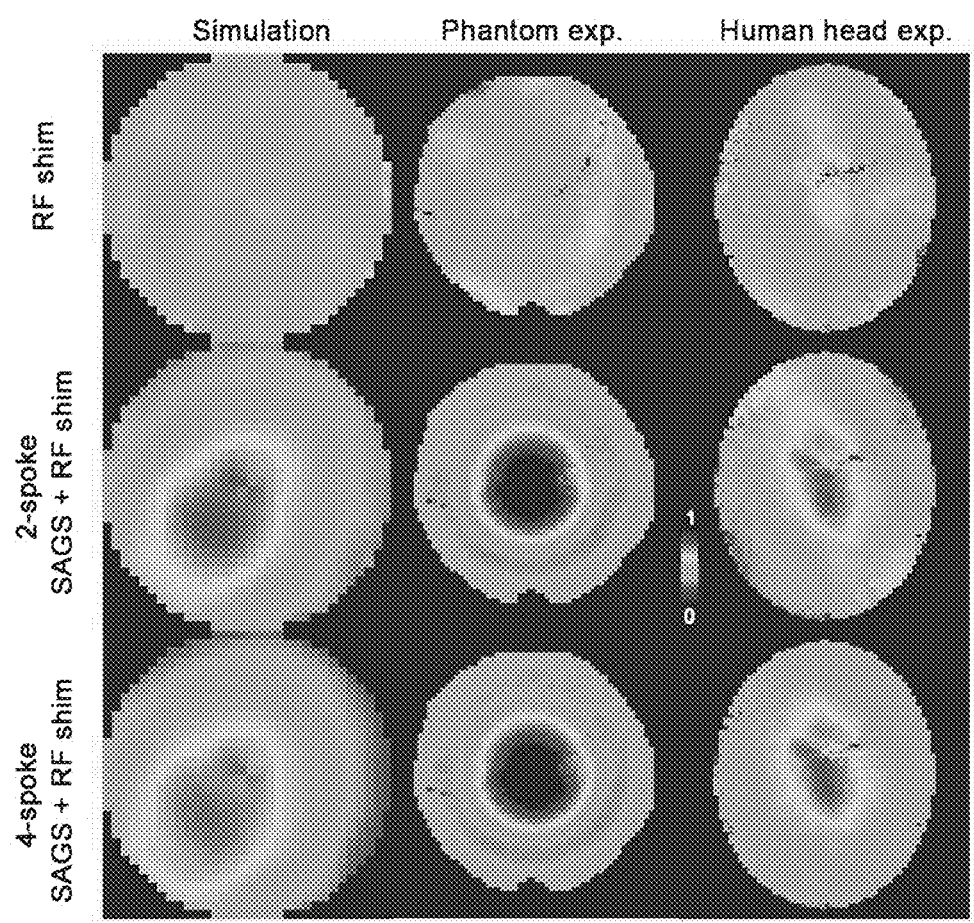
FIG. 4 shows the distribution of $B_{1shim}^+(x,y)$ in the conventional RF shimming method (using only linear SEMs; top row), the optimized 2-spoke combined SAGS and RF shimming method (middle row), and the optimized 4-spoke combined SAGS and RF shimming method (bottom row) using simulations, experimental saline phantom data, and experimental human head data.

FIG. 4 shows $B_1^+$ maps obtained with the conventional RF shimming method, which aims at achieving the most homogeneous $|B_1^+|$ (top row) and with the combination of SAGS and RF shimming using 2 (middle row) and 4 (bottom row) spokes, for simulated transmit coil sensitivies (left column) and experimental transmit coil sensitivies, for both a phantom (middle column) and a human head (right column). Regardless of the method, we observed some rapid intensity changes in the $|B_1^+|$ maps, potentially due to the rapid change of phase of the individual $B_1^+$ in measurements. On visual inspection, conventional RF shimming alone yielded relatively homogeneous $|B_1^+|$ distribution for both simulation and experimental data. The SAGS method combined with RF shimming resulted in more spatially inhomogeneous, but smoother $|B_1^+|$ distributions. If this $B_1^+$ distribution has iso-strength contours better fitted to a quadratic function, we can use nonlinear SEMs and SAGS to reduce the k-space dimension and a homogeneous transverse magnetization distribution can be more efficiently achieved (to be demonstrated in FIG. 6).

Figure 5:
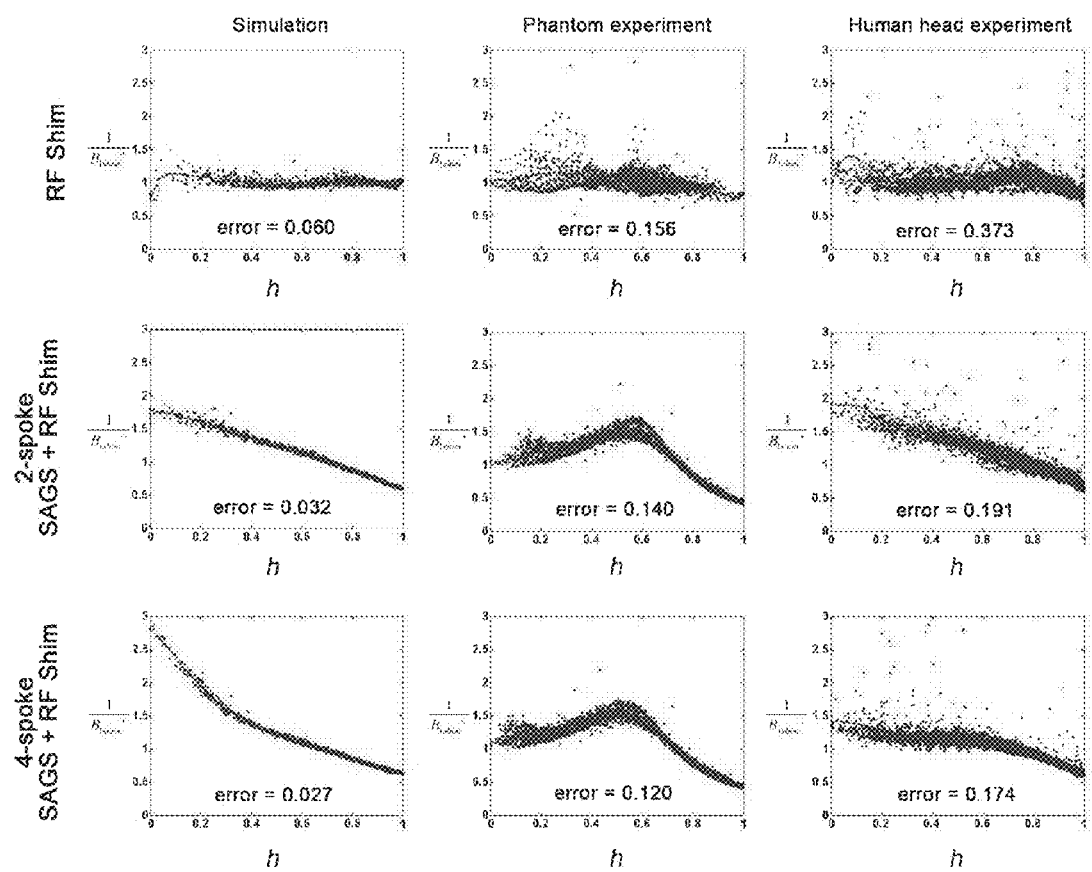
FIG. 5 shows the relationship between h(x,y) and $1/B_{1shim}^+(x,y)$ in the conventional RF shimming method (using only linear SEMs; top row), the optimized 2-spoke combined SAGS and RF shimming method (middle row), and the optimized 4-spoke combined SAGS and RF shimming method (bottom row) using simulations, experimental saline phantom data, and experimental human head data. The mapping error quantified by the root-mean-square of the residuals between (h(x,y), $1/B_{1shim}^+(x,y)$) pairs and a fitted curve using $10^{th}$-order polynomials is reported for each plot.

One key requirement for our method to generate homogeneous $M_{xy}$ is finding a one-dimensional function between $1/B_{1shim}^+(x,y)$ and $h(x,y)$ (Eq. [3]). To validate this requirement after RF shim, we plotted the distribution between $1/B_{1shim}^+(x,y)$ and $h(x,y)$ at all voxels in the imaging object (FIG. 5). Ideally, this distribution should be represented by one curve, which was estimated by a $10^{th}$-order polynomial (red curves in FIG. 5). Comparing between $B_1^+$ remapping using $B_{1shim}^+$ and conventional RF shim, across simulations and experimental data, we found $1/B_{1shim}^+(x,y)$ and $h(x,y)$ are more closely related to each other by a smooth one-dimensional function, because the fitted red curves fitted to the distribution of $(h(x,y), 1/B_{1shim}^+(x,y))$ pairs. However, there were some outlier data points, which might be due to inaccuracy in the experimental $B_1^+$ measurements, as mentioned above. Combining SAGS and RF shimming with 4 spokes rather than two improved the mapping between $1/B_{1shim}^+(x,y)$ and $h(x,y)$ compared to the 2-spoke case, for both simulation and experimental data (note reduced errors between middle and bottom row in FIG. 5).

Figure 6:
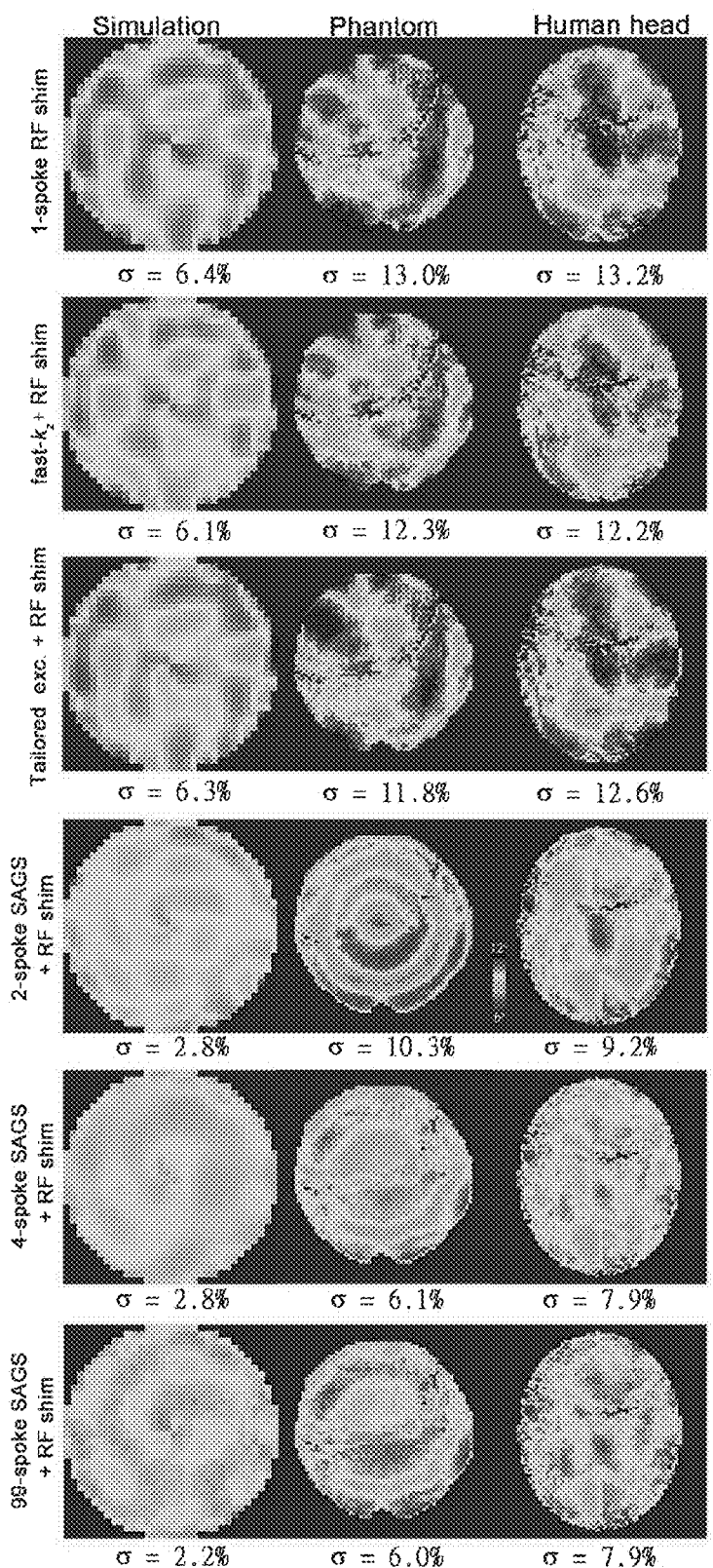
FIG. 6 shows the flip angle distribution maps obtained with the conventional RF shimming method (using only linear SEMs), the optimized 2-spoke combined SAGS and RF shimming method, the optimized 4-spoke combined SAGS and RF shimming method, and the combined SAGS and RF shimming method with 99 equi-spaced spokes using simulations, experimental saline phantom data, and experimental human head data. The relative standard deviation σ is reported below each map.

FIG. 6 shows the final flip angle distributions for all methods. RF shimming generated a relatively homogeneous flip angle distribution (top row in FIG. 6), matching the $B_1^+$ distribution (top row in FIG. 4). Quantitatively, when targeting a homogeneous flip angle distribution, the standard RF-shimming technique yielded σ=6.4%, 13.0%, and 13.2% for simulations, phantom, and human head experimental data, respectively. Fast-$k_z$ yielded σ=6.1%, 12.3%, and 12.2% for simulations, phantom, and human head experimental data, respectively. The tailored excitation method yielded σ=6.3%, 11.8%, and 12.6% for simulations, phantom, and human head experimental data, respectively. Both fast-$k_z$ and the tailored excitation method only marginally improved the flip angle homogeneity comparing to single pulse using conventional RF shimming, since the assumption of $B_1^+$ distribution for both methods were not satisfied.

The combined SAGS and RF shimming approach also generated homogeneous flip angle distributions (middle and bottom rows in FIG. 6), even though their $B_1^+$ distributions showed larger spatial variation than for RF shimming alone (FIG. 4 mid, bottom). Using combined RF shimming and 2 pulse SAGS, we found σ=2.8%, 8.4%, and 9.2% for simulations, phantom, and human head experimental data, respectively. Using combined RF shimming and 4 pulse SAGS, we found σ=2.8%, 7.6%, and 7.9% for simulations, phantom, and human head experimental data, respectively. Compared to RF shimming alone, the combined SAGS and RF shimming approach can generate a more homogeneous flip angle distribution. This suggests that, while a $B_1^+$ distribution can be visually suboptimal, when combined with quadratic SEMs, it may still result in a relatively homogeneous flip angle distribution if SEMs are optimally used. The bottom panel of FIG. 6 shows the flip angle distribution using the $B_{1shim}^+$ obtained from the combined SAGS and RF shimming method with 99 equi-spaced spokes. The results are similar to those of the 4-spoke combined SAGS and RF shimming method, suggesting that the number of spokes, after careful tuning of locations, amplitudes, and phases, is not the bottleneck for further improving the flip angle homogeneity.

Figure 7:
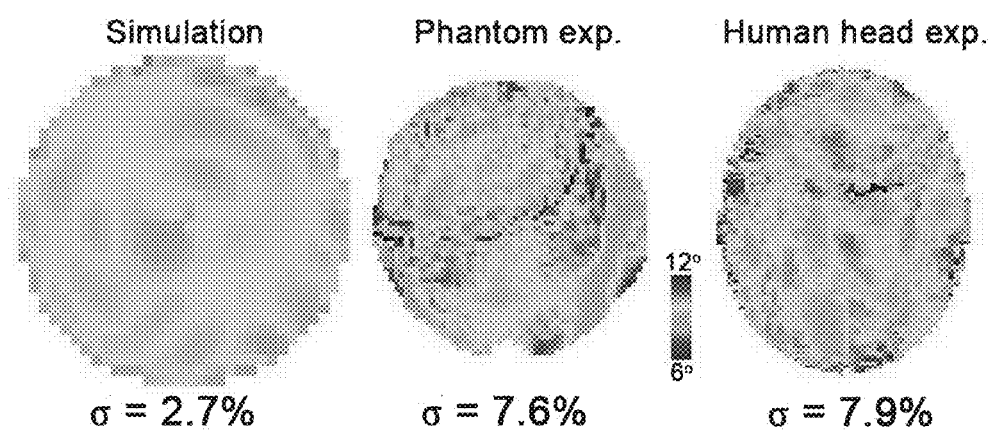
FIG. 7 shows the flip angle distribution maps generated by the optimized 2-spoke combined SAGS and RF shimming method using simulations, experimental saline phantom data, and experimental human head data. The initial guess for $B_{1shim}^+(x,y)$ was calculated by the conventional RF shimming method using only linear SEMs. The relative standard deviation σ is reported below each plot.

The initial guess for $B_{1shim}^+(x,y)$ in the calculations for FIGS. 2 and 4 was chosen as the CP mode of all transmission coils. We repeated the simulations using the result from conventional RF shimming as the initial guess to test the sensitivity of our method. We found that the results of the 2-spoke combined SAGS and RF shimming were not sensitive to the initial guess for $B_{1shim}^+(x,y)$ (FIG. 7). In fact, the flip angle distributions were similar when using either the CP mode (FIG. 6) or the $B_1^+$ obtained with conventional RF shimming (FIG. 7) as initial guess.

Under the small flip angle approximation (1), we proposed a method to improve flip angle homogeneity by remapping the spatial distribution of $B_1^+$ into a lower dimension coordinate system spanned by the nonlinear SEMs (SAGS) and optimizing a time-invariant combination of transmit amplitudes and phases from multiple RF coils (i.e., RF shimming) (Eq. [5]). In previous work on SAGS, we clearly demonstrated the advantage of $B_1^+$ remapping by implementing a simple pulse design using time-varying linear and nonlinear SEMs in a one-dimensional k-space to achieve a homogenous flip angle distribution efficiently (6). This study further extends the advantage of $B_1^+$ remapping to encompass RF shimming. Specifically, we used both simulated (20-channel transmit array) and experimentally measured (8-channel transmit array) transmit sensitivities to demonstrate the benefits of using linear and quadratic SEMs to achieve k-space dimension reduction and ultimately improve the homogeneity of the flip angle distribution (FIG. 6). Compared to the conventional one-spoke RF shimming method, the two-spoke SAGS method can improve the homogeneity of flip angle by 44% (6.4%→2.8%) relative standard deviation using simulation data, 47% (13.0%→6.1%) using phantom data and 60% (13.2%→7.9%) using human head data (FIG. 6). Importantly, our two-spoke SAGS method also outperformed the two-spoke tailor excitation method and 5-spoke fast-$k_z$ method (FIG. 6).

We want to emphasize the importance of simultaneously optimizing the combination of transmit coils and tailoring the combinations of linear and nonlinear SEMs. Intuitively, we could first use conventional RF shimming to search for the optimal complex-valued coil combination coefficients that achieve a homogeneous $B_1^+$ distribution (16). Then we would remap this $B_1^+$ distribution into a lower dimension using nonlinear SEMs. However, such a sequential approach may yield sub-optimal results and it would be instead preferable to perform RF shimming and $B_1^+$ remapping simultaneously, as suggested by the maps in the top panel of FIG. 2.

Two current limitations of our approach for improving flip angle homogeneity are related to $B_1^+$ remapping accuracy $M_{xy}(x,y)/B_1^+(x,y) \approx \tilde{M}_{xy}(h(x,y))$ and to using a finite number of spokes to construct a desired flip angle distribution $$\tilde{M}_{xy}(h(x, y)) = \sum_{spokes} W_{F'}(k_h)\exp[2\pi j k_h \cdot h(x, y)]. \quad \text{(Eq. [3])}$$

In FIG. 3, we show that flip angle homogeneity is similar between the results using 99 equi-spaced spokes and the results using 4 tailored spokes. This suggests that using only 4 spokes is not the bottleneck in improving the flip angle homogeneity, but rather that $B_1^+$ remapping is the key to the ultimate flip angle distribution. And comparing FIG. 5 and FIG. 6, we can observe roughly the smaller the fitting error in FIG. 5 corresponds to more homogeneous $M_{xy}$ distribution in FIG. 6.

The pulses designed by our proposed method can be seen as special cases of combining pTx and nonlinear SEMs (19). However, there are some differences: 1) like the RF shimming method, we only need one common driving RF amplifier to implement the RF pulse using a vector modulator to deliver the same waveform with varying amplitudes and phases for each transmit coil (7). Thus, the complexity and the cost are less than those of a pTx system and nonlinear SEMs. 2) The pulse sequence involving nonlinear SEMs is typically designed on a multi-dimensional k-space, whose dimension equals to the number of SEMs. SAGS-shim is one method to achieve similar results on a k-space with a reduced dimension. The benefit of such dimension reduction has been reported in our previous work (6). In short, SAGS simplifies the pulse design by transforming the optimization problem from a higher dimensional k-space to a lower dimensional one by seeking appropriate combinations of SEMs.

In this invention, we only restricted the spoke locations to be symmetrically located around the center of k-space. Naturally, allowing spokes with arbitrary locations, amplitudes, and phases can improve the results by increasing the degree of freedom of pulse design at the cost of higher complexity in optimization. However, it should be noted that, even using 4 spokes with the restriction of conjugate locations and equal amplitudes, we already got reasonably homogeneous $M_{xy}$ distribution (FIG. 6). Further improvement in $M_{xy}$ homogeneity is expected to be marginal by using more spokes or allowing a higher degree of freedom in pulse design.

In conclusion, we proposed a combined SAGS and RF shimming approach to mitigate $B_1^+$ inhomogeneity, a prominent artifact in high field imaging. Our simulations and experimental results suggest that this approach can be one method to facilitate structural and functional imaging at high fields.

What is claimed is:

1. A method for generating a flip angle spatial distribution of magnetic resonance imaging, comprising:
   incorporating the usage of a plurality of linear and nonlinear spatial encoding magnetic fields and the usage of a plurality of RF coils to generate a specific spatial distribution of flip angle, wherein the plurality of RF coils excites a $B_1^+$ field, the ratio of signal amplitudes of the plurality of RF coils is kept invariant during the excitation process, and the phase relationship of signals from the plurality of RF coils is kept invariant during the excitation process; and
   remapping the $B_1^+$ field by using the nonlinear spatial encoding magnetic fields.

2. The method as recited in claim 1, wherein the generated spatial distribution of flip angle is substantially homogeneous.

3. The method as recited in claim 1, further comprising adjusting the signal amplitudes of the plurality of RF coils by a single controller, wherein the ratio of signal amplitudes and the phase relationship of signals of the plurality of RF coils are kept invariant during the excitation process.

4. An apparatus for generating a flip angle spatial distribution of magnetic resonance imaging, comprising:
   a plurality of spatial encoding magnetic field coils; and
   a plurality of RF coils incorporated with the plurality of linear and nonlinear spatial encoding magnetic field coils to generate a specific spatial distribution of flip angle, wherein the plurality of RF coils excite a $B_1^+$ field that is remapped using a plurality of linear and nonlinear spatial encoding magnetic fields generated by the linear and nonlinear spatial encoding magnetic field coils, the ratio of signal amplitudes of the plurality of RF coils is kept invariant during the excitation process, and the phase relationship of signals from the plurality of RF coils is kept invariant during the excitation process.

5. The apparatus as recited in claim 4, wherein the generated spatial distribution of flip angle is substantially homogeneous.

6. The apparatus as recited in claim 4, further comprising:
   a single controller, adjusting the signal amplitudes of the plurality of RF coils, wherein the ratio of signal amplitudes and the phase relationship of signals of the plurality of RF coils are kept invariant during the excitation process.

* * * * *